United States Patent [19]

Olsen

[11] 4,018,605

[45] Apr. 19, 1977

[54] METAL LITHOGRAPHIC PLATE MADE IMAGEABLE BY DIFFUSION TRANSFER BY TREATMENT WITH GROUP IV-B METAL FLUORIDE

[75] Inventor: David B. Olsen, Lake Elmo, Minn.

[73] Assignee: Minnesota Mining and Manufacturing Company, St. Paul, Minn.

[22] Filed: Apr. 21, 1975

[21] Appl. No.: 569,873

[52] U.S. Cl. .............................. 96/29 L; 96/29 R; 96/33; 96/76 R; 101/458; 101/463; 148/6.2; 427/283; 427/287; 427/304; 427/328; 428/469; 428/472

[51] Int. Cl.² ..................... G03C 5/54; G03F 7/02; B44D 1/34; B41M 5/00

[58] Field of Search ......... 96/29 L, 33, 29 R, 76 R; 101/458, 463; 148/6, 2; 427/283, 287, 304, 328; 428/469, 472

[56] References Cited

UNITED STATES PATENTS

| | | | |
|---|---|---|---|
| 2,946,683 | 7/1960 | Mellan et al. | 96/33 |
| 3,160,506 | 12/1964 | O'Connor et al. | 96/33 |
| 3,186,842 | 7/1965 | DeHaas et al. | 96/29 L |
| 3,440,050 | 4/1969 | Chu | 96/33 |
| 3,891,516 | 6/1975 | Chu | 96/33 |

*Primary Examiner*—David Klein
*Assistant Examiner*—Richard L. Schilling
*Attorney, Agent, or Firm*—Cruzan Alexander; Donald M. Sell; Gerald F. Chernivec

[57] ABSTRACT

A hydrophilic-surfaced metallic foil capable of providing a lithographic printing plate upon imaging by the silver salt diffusion transfer process, the foil being treated with an aqueous solution of a water soluble Group IV-B hexavalent metal fluoride compound prior to imaging, and the lithographic plate so produced.

8 Claims, No Drawings

METAL LITHOGRAPHIC PLATE MADE IMAGEABLE BY DIFFUSION TRANSFER BY TREATMENT WITH GROUP IV-B METAL FLUORIDE

BACKGROUND OF THE INVENTION

This invention relates to a treated metallic substrate useful for preparing lithographic printing plates photographically and the plates prepared thereby. More specifically, the invention relates to treated metallic substrates capable of being photographically imaged by the silver salt diffusion process to thereby produce lithographic printing plates, and the plates so produced.

In the silver salt diffusion transfer process, an imagewise exposed silver halide emulsion layer is positioned in intimate contact with a receptor element and developed in the presence of a silver halide solvent such that the unexposed silver halide diffuses into the receptor element where it is then developed to provide an image thereon. Development nuclei, contained on the receptor element, cause the diffusing silver halide to be reduced to metallic silver, thereby forming the image on the receptor element surface.

When a lithographic plate is the desired end product, a receptor element is utilized having a surface which is sufficiently hydrophilic so as to accept aqueous fountain solution preferentially to oleo ink. Common receptor elements in this instance include foils of amphoteric metals such as aluminum, zinc or copper. Subsequent to imaging these metallic receptors by the silver salt diffusion process, the silver image areas can typically be treated to render them oleophilic, i.e., receptive to oleo ink, so as to provide a lithographic plate.

The metallic receptor elements must present a surface capable of developing transferred silver halide to metallic silver. Typically, the foil surface can be nucleated by deposit thereon of conventional development nuclei, such as colloidal silver, colloidal gold, metal sulfides, e.g. nickel sulfide or other materials which either are nuclei for development by themselves or which provide such nuclei by interaction with the diffused silver halide during image development. Alternatively, as is taught in U.S. Pat. No. 3,186,842, an aluminum surface itself, without treatment thereof with development nuclei, can actively participate in silver image development by an electrolysis mechanism to thereby provide a lithographic plate.

However, one problem area common to presently available metallic lithographic plates imaged by silver salt diffusion transfer is that of sufficient adhesion of the silver image areas to the metallic foil surface so as to withstand the rigor of extended press runs.

In contrast with such prior art, a simple treatment of hydrophilic-surfaced foil with water soluble Group IV-B metal fluoride compounds has been found to provide a nucleated metal surface to which the silver image areas adhere to the extent that extended press runs are available.

Utilization of Group IV-B metal fluoride compounds in the preparation of metal lithographic plates is known in the art. For example, U.S. Pat. No. 3,440,050 discloses treating anodized aluminum sheets with a hot aqueous bath of such fluoride compounds preparatory to applying a lightsensitive, e.g. diazo, coating thereover. After imaging and development to remove unexposed diazo, a lithographic plate is produced.

Such materials have also been utilized in solutions in combination have hexavalent chromium to render aluminum surfaces highly resistant to corrosion without marring the surface thereof, as is taught in U.S. Pat. No. 2,825,697.

However, to my knowledge, no one has determined that by a simple treatment of hydrophilic-surfaced metallic foil with such fluoride compounds, the treated foil can provide a lithographic receptor element imageable by the silver salt diffusion process wherein the silver image has excellent adhesion to the metal so as to provide a lithographic plate capable of extended press runs.

SUMMARY OF THE INVENTION

In accordance with the invention, hydrophilic-surfaced metallic foils can be simply treated with an aqueous solution of a water soluble Group IV-B metal fluoride compound thereby nucleating the metal surface to provide for effective reduction thereon of silver upon imaging by the silver salt diffusion transfer process.

This simple treatment of the metallic substrate allows for excellent adhesion of the transferred silver image thereto and a correspondingly durable lithographic plate capable of extended press runs.

DETAILED DESCRIPTION OF THE INVENTION

Metallic substrates useful in my invention include those amphoteric metals known in the art to have utility as lithographic plates, e.g., aluminum, copper, zinc, etc. with aluminum being preferred.

The substrate need not have any special pretreatment other than conventional chemical cleaning prior to nucleation with the fluoride compounds to be effective as a receptor for the diffused silver images. However, it is known that such metals exhibit a high degree of chemical activity when exposed to a normal atmospheric environment. This activity, generally resulting in oxidation of the metal surface and an oxide building thereon, has been found to several hinder silver transfer and adhesion to the metallic surface. Thus the storage stability of the metal substrate is somewhat minimal.

The metal surface can be effectively passivated, i.e. the natural chemical activity reduced, by conventional metal treatments such as anodizing, brush or chemical graining, etc. These treatments provide a uniform finite oxide layer on the metal surface, thereby passivating the surface, without diminishing the necessary hydrophilicity of the surface.

While such treatments can passivate the metal surface and correspondingly increase shelf life stability of the metal substrate, the oxide layer built up on the surface by such treatments can reduce adhesion of transferred silver. Therefore care should be undertaken that the oxide layer is as thin as possible while providing a uniform passivating layer over the entire metal surface. As the thickness of the oxide layer increases, adhesion of transferred silver correspondingly decreases.

A preferred treatment of the metallic foil, one found to effectively passivate the metal surface while maintaining optimum adhesion of transferred silver thereto, utilizes chromic acid. An aqueous chromic acid treatment bath having a concentration of from about 0.25 to 0.65 percent by weight chromic acid and maintained at about 15° C to 30° C has been found to provide excellent results. Metal treatment can be effected by simple insertion of the foil in the bath for about 15 to 40 seconds.

The metallic foil should first be typically cleaned in a conventional manner to remove mill oil, dirt, etc. from the foil surface. In the case of aluminum foil, a typical cleaner comprises an aqueous alkaline solution of trisodium phosphate, sodium hydroxide and sodium gluconate. A film of iron oxide and manganese dioxide, commonly termed smut, which is formed on the metal surface during the cleaning process, can be simply removed by treatment with nitric acid, whereby a chemically clean foil is obtained.

If the metallic foil is to be passivated by treatment with, for example chromic acid, such treatment should be undertaken as soon after chemically cleaning the foil as is practical.

After cleaning and, if desired, a passivating treatment as aforementioned, the metallic surface is nucleated to promote reduction of the transferred silver ion thereon. This is effectively accomplished by a simple treatment of the metal surface with a dilute aqueous solution of a water soluble Group IV-B metal fluoride compound having the formula:

$$X_1X_2F_6$$

wherein $X_1$ is hydrogen, an alkali metal, an alkaline earth metal, or an ammonium cation and $X_2$ is selected from the Group IV-B metals, i.e., titanium, zirconium and hafnium. Exemplary compounds include sodium hexafluorozirconate; potassium hexafluorotitanate, the preferred compound; potassium hexafluorohafnate; and ammonium hexafluorotitanate.

The fluoride compound can be simply dissolved in water to provide a treatment solution. Generally, the solution concentration should be at least about 0.01 percent by weight of fluoride compound to provide sufficient nucleation of the metal surface to effectively reduce the transferred silver to produce a useful image area. At a concentration greater than about 1.0 percent by weight of fluoride compound, a rapid reduction of silver occurs on the metallic surface, but adhesion of the silver image has been found to be somewhat reduced, thereby minimizing press life.

Solution temperatures of from about 18° to 24° C have been found satisfactory with corresponding residence times of from 5 seconds to about 50 seconds. With higher temperatures, residence time and/or solution concentration can be reduced. Similarly, lower temperatures would necessitate increased residence times and/or solution concentrations.

The exact nature of the interaction between the fluoride compounds and the metallic surface is not completely understood. While not intending to be limited by theory, it is thought that during treatment of the metallic foil with the fluoride compound, an oxide of the Group IV-B metal is created in situ on the metallic surface, thereby constituting nucleating sites for promotion of silver reduction. In any event, adequate silver transfer and reduction is effected with the transferred silver having excellent adhesion onto the metallic foil surface.

Wter rinses are conveniently utilized after each treatment step to essentially terminate further chemical reaction by dilution of the reactive treatment constituents. This eliminates necessity of further chemical "stop-bath" treatment of the foil.

Because of the extreme chemically active nature of the metallic foil surfaces utilized herein, the type of rinse water utilized after each treatment step has been found to be critical. Active metal ions, such as calcium and magnesium, will be strongly attracted to the foil surface which can correspondingly adversely affect silver transfer and adhesion. Therefore, rinse waters essentially free of metal ions are deemed necessary for optimum plate properties. Deionized water or distilled water having a conductivity of greater than 200,000 ohms resistance have been found satisfactory.

Imaging by silver halide diffusion transfer is of course amply described in the patent literature. The process typically utilizes a light-sensitive silver halide emulsion layer which after imagewise exposure, is developed in the presence of a silver halide solvent. During this development, the silver halide emulsion layer is in close contact with a receptor typically containing thereon silver reduction nuclei. Unexposed silver halide, dissolved by the silver halide solvent, diffuses to the receptor where it is reduced to a metallic silver image.

The metallic silver image can then be rendered oleophilic, i.e., ink receptive, by chemical treatment such as is taught in U.S. Pat. No. 3,186,842.

The invention will now be more specifically illustrated by the following nonlimiting examples wherein all parts are by weight unless otherwise noted.

EXAMPLE I

A smooth-surfaced aluminum foil having a thickness of 3.5 mils was immersed for 40 seconds in a 70° C aqueous cleaning solution consisting of 1.2 percent by weight of trisodium phosphate, 1.2 percent by weight of sodium hydroxide and 0.04 percent by weight of sodium gluconate, thereby effecting an etch loss of 0.70 grams per square foot followed by a thorough rinsing in deionized water to remove the cleaning solution and soluble reaction products.

The foil was then desmutted by immersion for 30 seconds in a 22° C 48 percent by weight aqueous nitric acid bath and again rinsed thoroughly with deionized water.

The foil was then immersed into a 0.50 percent by weight aqueous chromic acid bath at 22° C for a period of 45 seconds and again thoroughly rinsed with deionized water.

The foil was then immersed in a 0.25 percent by weight aqueous solution of potassium hexafluorotitanate at 22° C for a period of 45 seconds followed by thorough rinsing with deionized water. The foil is now effectively passivated and storage stable.

The so-treated foil and an imagewise exposed negative photographic paper having a conventional silver chloride emulsion thereon are passed through an aqueous monolith developer solution of the following composition:

16 parts sodium hydroxide,
80 parts sodium sulfite,
4 parts sodium thiosulfite,
1 part potassium bromide,
16 parts hydroquinone,
1 part 1-phenyl-3-pyralozidone,
882 parts water.

The foil and exposed negative are brought into intimate contact for a period of 10 seconds. Upon separation, the unexposed silver halide has been transferred to the aluminum foil and reduced thereon to metallic silver.

The imaged aluminum foil was then treated in accordance with U.S. Pat. No. 3,186,842 with the following solution to thereby render the metallic silver image areas oleophilic.

3.24 parts carboxymethylcellulose,
0.60 parts trisodium phosphate,
0.30 parts phosphoric acid,
0.06 parts cetyltrimethylammonium bromide,
1.0 parts 20 percent by weight aqueous, formaldehyde solution water to make 100 ml.

The imaged plate was then placed on a conventional offset press, whereupon in excess of 15,000 good quality impressions were produced.

EXAMPLE II

An aluminum foil was cleaned, desmutted, and treated with chromic acid as per Example I followed by immersion in a 0.25 percent by weight aqueous solution of potassium hexafluorozirconate at 22° C for 45 seconds and then rinsed with deionized water.

The so-treated foil, when imaged by diffusion transfer as per Example I, provided a lithographic plate which produced in excess of 5,000 good quality impressions when run on a conventional offset press.

EXAMPLE III

The surface of an aluminum alloy foil was brushed with a slurry of soap, clay and aluminum oxide to thereby grain the aluminum surface and provide thereon a finite uniform oxide layer followed by rinsing with dionized water. The grained aluminum was treated with potassium hexafluorotitanate and imaged as per Example I whereupon a lithographic plate comparable to Example II was produced.

What is claimed is:

1. A lithographic plate comprising a hydrophilic-surfaced metal support having oleophilic image areas thereon, said image areas comprising metallic silver deposited on said metal support in an imagewise manner by the silver salt diffusion transfer process, said metal support having been treated prior to depositing of said image areas by said silver salt diffusion transfer process with an aqueous solution containing from about 0.01 to about 1.0 percent by weight of a water soluble Group IV-B metal fluoride compound of the formula:

wherein $X_1$ is hydrogen, an alkali metal, an alkaline earth metal or an ammonium cation and $X_2$ is a titanium, zirconium or hafnium cation at a temperature of from about 18° C. to about 24° C. for about 5 to about 50 seconds.

2. The lithographic plate of claim 1 wherein said metal support was treated with an aqueous solution containing from about 0.25 to about 0.65 percent by weight of chromic acid at a temperature of about 15° C to 30° C for about 15 to about 40 seconds prior to treatment with said fluoride compound.

3. The lithographic plate of claim 2 wherein said metal support is aluminum.

4. The lithographic plate of claim 1 wherein said fluoride compound is potassium hexafluorotitanate.

5. A process for preparing a lithographic plate comprising:
  a. treating a hydrophilic-surfaced metallic support with an aqueous solution containing from about 0.01 to about 1.0 percent by weight of a water soluble Group IV-B metal fluoride compound of the formula:

wherein $X_1$ is hydrogen, an alkali metal, an alkaline earth metal or an ammonium cation and $X_2$ is a titanium, zirconium or hafnium cation at a temperature of from about 18° C to 24° C for about 5 to about 50 seconds; and
  b. imaging the treated support by the silver salt diffusion transfer process.

6. The process of claim 5 wherein said metallic support is first treated with an aqueous solution containing from about 0.25 to about 0.65 percent by weight of chromic acid at a temperature of from about 15° C to about 30° C for about 15 to about 40 seconds.

7. The process of claim 5 wherein said metal support is aluminum.

8. The process of claim 5 wherein said fluoride compound is potassium hexafluorotitanate.

* * * * *

UNITED STATES PATENT AND TRADEMARK OFFICE
CERTIFICATE OF CORRECTION

PATENT NO. : 4,018,605
DATED : April 19, 1977
INVENTOR(S) : David B. Olsen

It is certified that error appears in the above-identified patent and that said Letters Patent are hereby corrected as shown below:

Column 2, line 39, "building" should read -- buildup --;

Column 2, line 40, "several" should read -- severely --;

Column 3, line 1, "insertion" should read -- immersion --;

Claim 3, line 1, "claim 2" should read -- claim 1 --.

Signed and Sealed this twenty-third Day of August 1977

[SEAL]

Attest:

RUTH C. MASON
Attesting Officer

C. MARSHALL DANN
Commissioner of Patents and Trademarks